(12) United States Patent
Miyamori et al.

(10) Patent No.: US 7,060,622 B2
(45) Date of Patent: Jun. 13, 2006

(54) METHOD OF FORMING DUMMY WAFER

(75) Inventors: Yuichiro Miyamori, Miyazaki (JP); Munenori Hidaka, Miyazaki (JP); Masashi Yoshida, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 300 days.

(21) Appl. No.: 10/667,511

(22) Filed: Sep. 23, 2003

(65) Prior Publication Data

US 2004/0063324 A1    Apr. 1, 2004

Related U.S. Application Data

(60) Provisional application No. 60/413,943, filed on Sep. 27, 2003.

(51) Int. Cl.
*H01L 21/302* (2006.01)

(52) U.S. Cl. .................... 438/697; 438/703; 438/722
(58) Field of Classification Search ................ 438/697, 438/703, 722
See application file for complete search history.

(56) References Cited

U.S. PATENT DOCUMENTS

| | | | | |
|---|---|---|---|---|
| 3,775,262 A | * | 11/1973 | Heyerdahl | 438/287 |
| 5,141,603 A | * | 8/1992 | Dickey et al. | 205/124 |
| 5,296,385 A | * | 3/1994 | Moslehi et al. | 438/514 |
| 5,746,928 A | | 5/1998 | Yen et al. | |
| 5,810,937 A | | 9/1998 | Gupta et al. | |
| 6,159,333 A | | 12/2000 | Gupta et al. | |
| 6,358,821 B1 | * | 3/2002 | Gupta et al. | 438/476 |
| 6,394,104 B1 | | 5/2002 | Chen et al. | |
| 2003/0075452 A1 | * | 4/2003 | Hsu et al. | 205/203 |

FOREIGN PATENT DOCUMENTS

JP    08-316283    11/1996

* cited by examiner

*Primary Examiner*—Nadine Norton
*Assistant Examiner*—Binh X. Tran
(74) *Attorney, Agent, or Firm*—Rabin & Berdo, PC

(57) ABSTRACT

According to the present invention, a dummy wafer is formed by forming a masking film on a rear surface of a silicon wafer; spray coating aluminum and depositing an aluminum film on a front surface of the silicon wafer; spray coating ceramics or carbon and depositing a ceramic film or carbon film on the aluminum film so that the aluminum film may be completely covered; and removing the masking film formed on the rear surface. Also, a dummy wafer can be formed by using an aluminum wafer as a wafer substrate and subjecting it to anodic oxidation to form a film of aluminum oxide.

17 Claims, 2 Drawing Sheets

METHOD OF FORMING DUMMY WAFER

The rights of priority are claimed under 35 of USC § 119 of U.S. Provisional Application No. 60/413,943, filed Sep. 27, 2003.

BACKGROUND OF THE INVENTION

1. Field of the Invention

The present invention relates to a method of fabricating a dummy wafer, in particular to a dummy wafer that is used in the plasma cleaning and so on.

2. Description of the Related Art

In existing plasma-generating semiconductor fabrication apparatus, when a wafer is processed, reaction products adhere to a processing chamber and floating dust resulting therefrom is generated. In the case of the reaction product adhering to the wafer, a semiconductor element formed on the wafer deteriorates in the characteristics and owing to the floating dust the pattern short defect or the like increases; accordingly, periodical in-line cleaning of the inside of the chamber has to been carried out.

At this time, in order to inhibit a lower electrode base material in the chamber from deteriorating owing to the plasma and to suppress the inside of the chamber from being contaminated, a silicon (Si) dummy wafer is used to be placed in the chamber and to be subjected to the plasma processing. As the dummy wafer for use in the cleaning, since a gas for decomposing the reaction product with the plasma thereof is supplied in the chamber, not a bare silicon wafer but a wafer provided with a silicon oxide film ($SiO_2$) is used.

However, the wafer with silicon oxide film, when exposed to the plasma, is etched and the silicon oxide film is removed from on the silicon wafer. Accordingly, the silicon oxide film is repeatedly formed. In the regeneration of the silicon oxide film, after the wet etching, a silicon oxide film is formed; accordingly, it takes operation steps and fabrication time due to the regeneration.

Furthermore, the number of times of regeneration of the dummy wafer, owing to deterioration of a surface state of the wafer itself and the warping thereof, is increased so that a use lifetime of the silicon wafer is shorten; that is, in total, the number of the wafers that are used results in an increase and the fabrication cost results in an increase. Still furthermore, as other dummy wafer, a ceramic wafer can be considered; however, it is high in the cost. In addition, being different in the surface roughness from that of the silicon wafer when transferring the wafer in the semiconductor fabrication apparatus, or being different in the light reflectance from that of silicon material at the sensing, it is not suitably used in the semiconductor fabrication apparatus in which the silicon wafer is transferred.

SUMMARY OF THE INVENTION

A method of forming a dummy wafer according to a first invention includes forming a masking film on a rear surface of a silicon wafer; spray coating aluminum and thereby depositing an aluminum film on a front surface of the silicon wafer; spray coating ceramics or carbon and thereby depositing a ceramic film or carbon film on the aluminum film so that the aluminum film may be completely covered; and removing the masking film formed on the rear surface.

A method of forming a dummy wafer according to a second invention includes polishing a rear surface of an aluminum wafer; and after the polishing, a front surface of the aluminum wafer is subjected to anodic oxidation and thereby forming a film of aluminum oxide. The rear surface of the aluminum wafer is polished to mirror-finish.

DETAILED DESCRIPTION OF THE INVENTION

First Embodiment

Figure 1A:
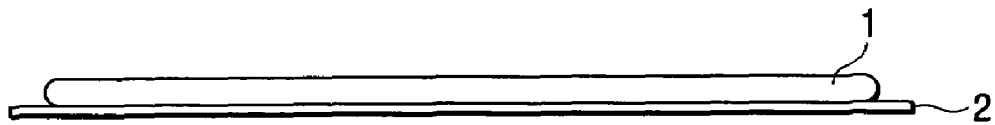
FIGS. 1A through 1C are sectional views showing a method of fabricating a dummy wafer in which a ceramic film is formed on a silicon wafer.
Figure 1B:
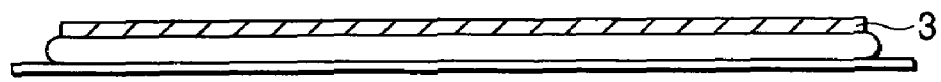
Figure 1C:
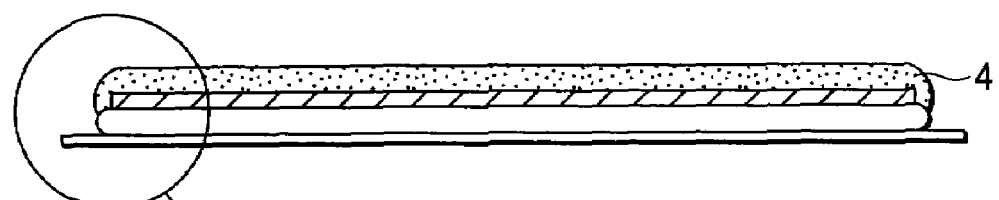

First, a rear surface of a silicon wafer 1 is masked with a mask 2 such as a film and so on (FIG. 1A). Subsequently, on a front surface of the silicon wafer 1, without applying the blasting, an aluminum (Al) film 3 is spray coated to form a film (FIG. 1B). On the spray coated aluminum film 3, ceramics that are an aluminum compound is spray coated, and thereby on an entire surface a ceramic film 4 is formed (FIG. 1C).

Figure 2:
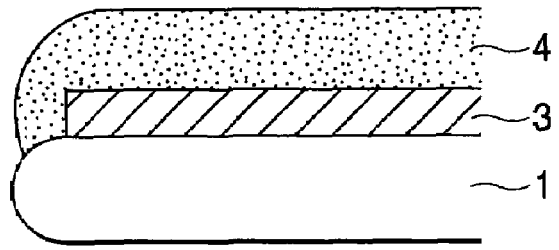
FIG. 2 is an enlarged view of an end portion of the wafer shown in FIG. 1C.

In the above, when the aluminum film 3 is formed as an undercoating, because of difference of the surface roughness between silicon and aluminum and a higher bonding strength between the ceramics (aluminum oxide) that is an aluminum compound and the aluminum than that of silicon and aluminum, without applying the blasting, the ceramics can be spray coated. At this time, the aluminum film 3 at an edge of the silicon wafer 1 is covered with a ceramic spray coating film 4 (FIG. 2).

Thereafter, the mask 2 on the rear surface of the silicon wafer 1 is removed, followed by washing with deionized water. The ceramic film 4, being excellent in the plasma resistance, even when exposed to the plasma, is slight in a polished amount, causing no problem in the environmental pollution. According to the present fabricating method, a film thickness of the aluminum spray coated film 3 as the undercoating is not particularly restricted. As to the film during the alumina spray coating, there are methods of forming flat and forming with a thickness distribution in a plane.

Furthermore, when the aluminum film is spray coated on the silicon wafer surface, a bonding strength between silicon and aluminum is increased, furthermore when the ceramics are spray coated on the aluminum surface, the bonding strength between the aluminum film and the ceramic film is increased; accordingly, the ceramic film can be formed thicker. At the edge portion of the silicon wafer, by covering the spray coated aluminum film, the aluminum can be suppressed from being contaminated.

Figure 3:
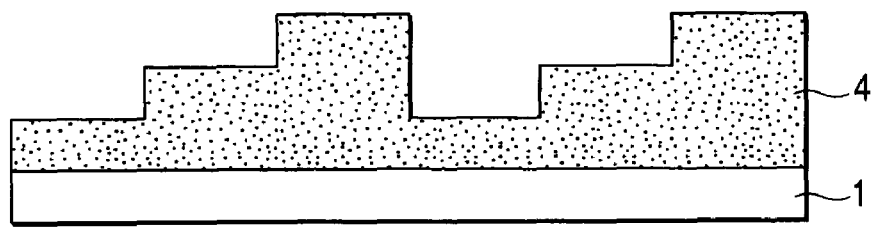
FIG. 3 is a sectional view showing a dummy wafer that has a film thickness distribution according to a first embodiment.

Furthermore, when the thickness distribution in a plane is changed, a wafer structure fit to the characteristics of the apparatus that is used can be formed. That is, by generating thicker a portion in a plane that is fast in the etching rate, a replacement interval can be extended (FIG. 3).

Figure 4:
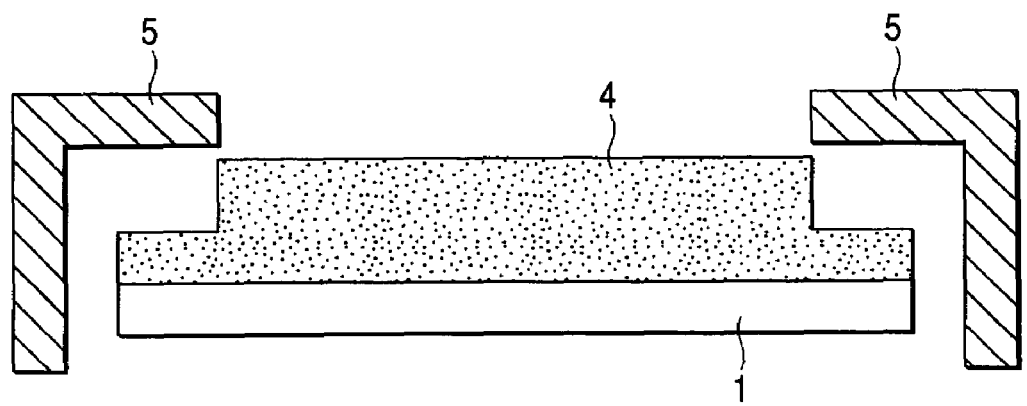
FIG. 4 is a sectional view showing a dummy wafer according to a first embodiment in which a portion with which a clamp comes into contact is made thin in the film thickness.

In the present embodiment, an example suitable for the apparatus that has no relation to the clamp is explained; however, when the invention is applied to the apparatus having a clamp, a clamp portion is formed into a film thickness of 670 μm, and a portion other than the clamp portion is made thicker in the spray coating film thickness, and thereby the replacement period of the wafer can be made further longer (FIG. 4).

Figure 5:
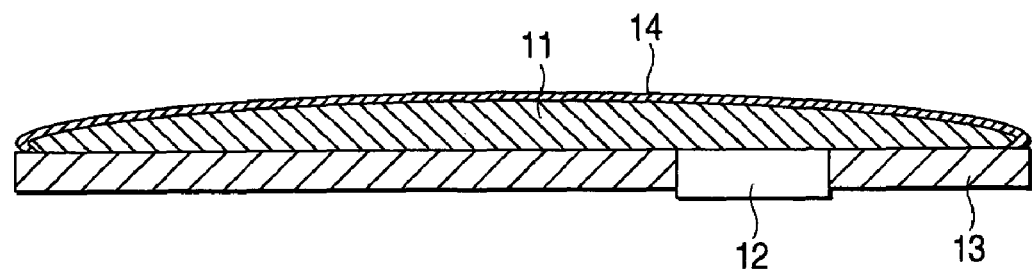
FIG. 5 is a sectional view showing an aluminum wafer in a state being subjected to the anodic oxidation according to a second embodiment.

When the carbon spray coating thin film is used instead of the ceramic spray coating film, it can be used as a wafer for confirming wafer transfer. In this case, aluminum is used as the undercoating, and black carbon is spray coated thereon; accordingly, when the wafer that is spray coated with carbon is bruised during the transfer, the bruised portion can be seen white, resulting in enabling to judge transfer displacement. At this time, when the carbon thickness is differentiated between the wafers, with wafers different in the depth of the bruise and in the carbon spray coating film thickness, a height of the transfer displacement can be judged (FIG. 5).

Second Embodiment

First, an aluminum substrate 11 is cut to a thickness of 1000 μm and formed into a shape the same as that of a wafer. All are the same with respect to presence or absence of an orientation flat and a notch. A surface of the wafer is polished, an electrode 12 is attached to a rear surface of the wafer, and a portion other than the electrode 12 is covered with a masking material 13 (FIG. 5). The masking material may be any one as far as it can withstand an acid that is used when the anodic oxidation is applied. According to the anodic oxidation, an aluminum oxide film 14 having a thickness of 100 μm or more is formed on a front surface of the wafer. In the next place, the rear surface of the wafer is polished, and thereby a rear surface of the aluminum substrate 11 is polished to mirror finish. At this time, a thickness of aluminum is adjusted to substantially 670 μm, followed by washing the aluminum wafer with deionized water.

As mentioned above, in the mode of the present embodiment, an aluminum substrate is used, and thereby the wafer can be made lighter in weight. Aluminum oxide is superior in the plasma resistance to an existing silicon oxide film and smaller in an amount polished during etching. Accordingly, even in the plasma cleaning, a replacement lifetime can be made longer. In the mode according to the present embodiment, though the hardness varies depending on the film thickness of aluminum oxide, in order to have sufficient plasma resistance, a thickness of 100 μm or more is preferable.

Furthermore, by controlling the conditions for forming aluminum oxide and thereby forming a thin film having a thickness of 30 μm or less, or by lowering the hardness of the film, the aluminum wafer can be utilized as a dummy wafer for confirming wafer transfer. Since the substrate of the aluminum oxide film that is normally looked brown black is aluminum, a bruised portion of the wafer is seen whitish owing to the irregularity during the wafer transfer confirmation, and thereby misalignment during the wafer transfer can be detected.

What is claimed is:

1. A method of forming a dummy wafer comprising:
   providing a dummy wafer having a front surface and a back surface;
   forming a masking film on the back surface of the dummy wafer;
   spray coating aluminum on the front surface of the dummy wafer so as to form an aluminum film;
   spray coating a covering material on the aluminum film so that the aluminum film is completely covered by a covering film; and
   removing the masking film.

2. The method of forming a dummy wafer as set forth in claim 1, wherein the covering film is selected from the group consisting of a ceramic film and a carbon film.

3. The method of forming a dummy wafer as set forth in claim 2, wherein a peripheral edge portion of the aluminum film is covered with the ceramic film.

4. The method of forming a dummy wafer as set forth in claim 2, wherein the ceramic film is a film of aluminum oxide.

5. The method of forming a dummy wafer as set forth in claim 2, wherein the covering film has a film thickness distribution.

6. A method of forming a dummy wafer comprising:
   processing aluminum into a wafer shape to provide an aluminum dummy wafer having a front surface and a back surface;
   polishing the front surface of the aluminum dummy wafer;
   attaching an electrode to a part of the back surface of the aluminum dummy wafer;
   covering the back surface with a masking film except the electrode;
   applying anodic oxidation to the aluminum dummy wafer so sa to form an aluminum oxide film on the front surface of the aluminum dummy wafer;
   removing the electrode and the masking film; and
   applying mirror polishing to the back surface of the wafer after the step of removing.

7. The method of forming a dummy wafer according to claim 6, wherein the aluminum dummy wafer has a thickness of about 1000 μm.

8. The method of forming a dummy wafer according to claim 6, wherein the aluminum oxide film has a thickness of about 100 μm.

9. The method of forming a dummy wafer according to claim 6, wherein the aluminum oxide film has a thickness of about less than 30 μm.

10. The method of forming a dummy wafer according to claim 6, wherein the aluminum dummy wafer alter applying minor polishing has a thickness of about 670 μm.

11. The method of forming a dummy wafer according to claim 6,
   further comprises washing the aluminum dummy wafer with deionized water after applying the mirror polishing.

12. A method of forming a dummy wafer comprising:
   providing a silicon dummy wafer having a front surface and a back surface;
   forming a masking film on the back surface of the silicon dummy wafer;
   thermally spraying aluminum on the front surface of the silicon dummy wafer so as to form an aluminum film on the front surface the of the silicon dummy wafer;
   thermally spraying a covering material on the aluminum film so that the aluminum film is covered by a covering film;
   removing the masking film after thermally spraying the covering material; and
   washing the silicon dummy wafer with deionized water after removing the masking film.

13. The method of forming a dummy wafer according to claim 12, wherein blasting is not applied to the front surface of the silicon dummy wafer.

14. The method of forming a dummy wafer according to claim 12, wherein the covering material is selected from the group consisting of ceramic and carbon.

15. The method of forming a dummy wafer according to claim 14, wherein the ceramic is made of aluminum oxide.

16. The method of forming a dummy wafer according to claim 12, wherein a thickness of a peripheral portion of the aluminum film and the covering film is smaller than that of a central portion.

17. The method of forming a dummy wafer according to claim 16, wherein the thickness of the peripheral portion is about 670 μm.

* * * * *